(12) United States Patent
Brioschi et al.

(10) Patent No.: US 11,172,314 B2
(45) Date of Patent: Nov. 9, 2021

(54) PACKAGING FOR A MEMS TRANSDUCER

(71) Applicant: Cirrus Logic International Semiconductor Ltd., Edinburgh (GB)

(72) Inventors: Roberto Brioschi, Austin, TX (US); Rkia Achehboune, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/825,549

(22) Filed: Mar. 20, 2020

(65) Prior Publication Data
US 2020/0304923 A1 Sep. 24, 2020

Related U.S. Application Data

(60) Provisional application No. 62/822,150, filed on Mar. 22, 2019.

(30) Foreign Application Priority Data

Apr. 29, 2019 (GB) ...................................... 1905927

(51) Int. Cl.
*H04R 19/00* (2006.01)
*H04R 19/04* (2006.01)
(Continued)

(52) U.S. Cl.
CPC ............ *H04R 19/04* (2013.01); *B81B 7/0032* (2013.01); *H04R 19/005* (2013.01);
(Continued)

(58) Field of Classification Search
CPC .............. H04R 19/04; H04R 2201/003; H04R 2499/11; H04R 19/005; H04R 1/342; H04R 1/04; H04R 31/006; B81B 7/0061; B81B 2201/0257; B81B 2207/012; B81C 1/00309
See application file for complete search history.

(56) References Cited

U.S. PATENT DOCUMENTS

2007/0189558 A1* 8/2007 Ogura ................. H04R 19/005
381/191
2010/0128914 A1 5/2010 Khenkin
(Continued)

FOREIGN PATENT DOCUMENTS

| CN | 203840542 U | 9/2014 |
|---|---|---|
| WO | 2018001937 A1 | 1/2018 |

OTHER PUBLICATIONS

Combined Search and Examination Report under Sections 17 and 18(3), UKIPO, Application No. GB1905927.8, dated Sep. 25, 2019.
(Continued)

*Primary Examiner* — Matthew A Eason
(74) *Attorney, Agent, or Firm* — Jackson Walker L.L.P.

(57) ABSTRACT

The application describes a package substrate for a MEMS transducer package having a recessed region formed in an upper surface of the package substrate. The recessed region extends only partially through the package substrate from an opening in the upper surface of the package substrate in a first direction towards the lower surface of the substrate. The recessed region extends only partially through the package substrate from an opening in a side surface of the package substrate in a second direction towards an opposite side surface.

19 Claims, 8 Drawing Sheets

(51) Int. Cl.
*B81B 7/00* (2006.01)
*H04R 31/00* (2006.01)

(52) U.S. Cl.
CPC .... *H04R 31/006* (2013.01); *B81B 2201/0257* (2013.01); *H04R 2201/003* (2013.01); *H04R 2201/02* (2013.01)

(56) References Cited

U.S. PATENT DOCUMENTS

| | | | | |
|---|---|---|---|---|
| 2016/0165330 A1* | 6/2016 | Minervini | .............. | H04R 1/028 |
| | | | | 374/142 |
| 2016/0277831 A1* | 9/2016 | Manley | ................. | H04R 1/342 |
| 2017/0347174 A1* | 11/2017 | Chandrasekaran | .... | H04R 19/04 |
| 2018/0005969 A1* | 1/2018 | Suvanto | ................. | H01L 24/48 |

OTHER PUBLICATIONS

Examination Report under Section 18(3), UKIPO, Application No. GB1905927.8, dated Sep. 23, 2021.

\* cited by examiner

FIG. 5
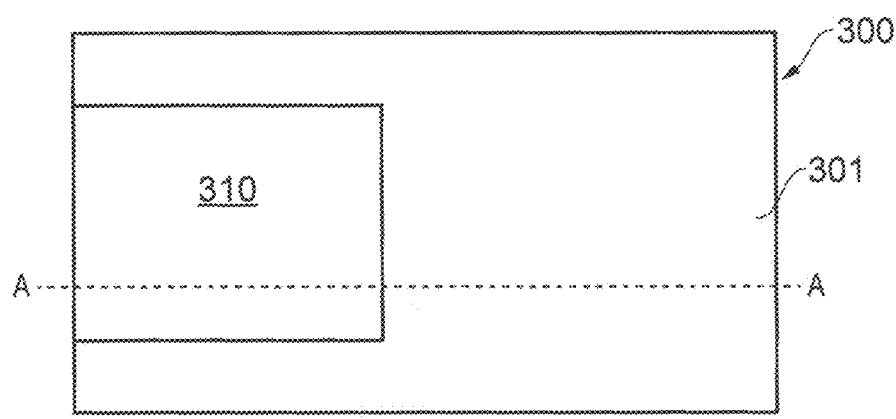
FIG. 5a
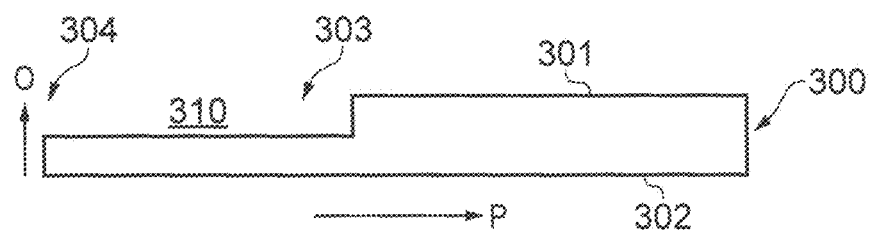
FIG. 5b

PACKAGING FOR A MEMS TRANSDUCER

TECHNICAL FIELD

This application relates to packaging for a micro-electromechanical system (MEMS) device and to processes for fabricating such packaging. In particular, this application relates to packaging for a MEMS capacitive microphone device and also to packaging processes.

BACKGROUND

MEMS devices are becoming increasingly popular. MEMS transducers, and especially MEMS capacitive microphones, are increasingly being used in portable electronic devices such as mobile telephones, headphones and other portable devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

A MEMS transducer will typically be housed within a package which allows easy handling and assembly and serves to protect the primary substrate and the component supported thereby from e.g. mechanical damage, RF noise and environmental contamination. The package also provides a means—e.g. an external conductive contact—for connecting the package to a circuit board or other elements.

Various packaging configurations are known. For example, a package for a MEMS transducer typically comprises a package substrate, which may be formed of a printed circuit board (PCB) or silicon, and a cover portion which extends in a plane overlying the upper surface of the package substrate supported by side walls. The cover portion and side walls may be provided by e.g. a metallic lid which is attached to the upper surface of the package substrate. Alternatively, the cover portion and the side walls may be formed of two further PCBs. The three PCBs are bonded together wherein the middle PCB comprises an opening which defines the chamber of the package. The MEMS transducer is attached to the upper surface of the package substrate within the chamber.

A package which houses a microphone transducer will typically have a sound port to allow transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

According to known package designs the sound port is provided in the cover portion of the package. In alternative known package designs the sound port is provided in the package substrate.

A packaged microphone transducer may be provided for use in a host device such as a mobile phone or other electronic device. Typically the package substrate is mounted and electrically connected to a host PCB or other substrate of the host device. It is typically necessary to mount a packaged microphone transducer close to a sound port formed in the outer boundary edge or cover of the host device in order to facilitate ingress of acoustic pressure waves (i.e. sound) into the front volume of the microphone transducer. Typically, a member providing a sound channel, e.g. a gasket, is typically interposed between sound port of the transducer package and the sound port provided in the device cover.

In many applications a packaged MEMS transducer will be mounted such that the sound port of the package is at least partially aligned with the acoustic port provided in the device cover. Thus, if the sound port of the package is projected in a direction normal to the sound port onto the plane of the device cover, then the boundary of the sound port will at least partly overlie the acoustic port provided in the device cover. Thus, any interposer member or gasket that provides a channel or conduit for fluid communication between the two sound ports may be generally longitudinal in form.

However, in some applications it may be necessary or advantageous for the MEMS transducer package to be mounted such that the sound port of the package is not aligned with the acoustic port of the device cover. In other words, there is a lateral offset between the acoustic port of the device cover and an orthogonal projection of the sound port of the transducer package onto the plane of the device cover. In this case, according to prior arrangements it has been proposed that a sound channel or gasket defining a more complex form is interposed between the sound port of the package and the sound port of the device. Thus, the sound channel may not define a straight line path between the two ports and may, for example, comprise one or more turns or bends in the path provided by the sound channel in order to direct and channel acoustic pressure waves between the ports.

In circumstances where the acoustic port of a microphone transducer package does not overly the acoustic port of the device cover when viewed in a direction normal to one of the ports, it will be appreciated that a more complex gasket design is required in order to direct or channel sound pressure waves between the two ports. Furthermore, the provision of one or more turning points or bends in the interposer member may render it more prone to folding and/or vulnerable to collapse.

The present examples are directed to the problem of channelling and/or directing acoustic pressure waves between the acoustic port of a device cover and the acoustic port of a microphone package, in particular in circumstances where the two ports are not aligned.

According to a first example of a first aspect there is provided package substrate for a MEMS transducer package, the package substrate comprising a recessed region formed in an upper surface of the package substrate, wherein the recessed region extends only partially through the package substrate from an opening in the upper surface of the package substrate in a first direction towards the lower surface of the substrate, and wherein the recessed region extends only partially through the package substrate from an opening in a side surface of the package substrate in a second direction towards an opposite side surface.

The package substrate may be formed of a semiconductor material, such as silicon. The recessed region may be considered to be region where the semiconductor material has been removed or is absent. The recessed region may have a cross sectional area defining a square or rectangular shape. The package substrate may further comprising one or more vias or through-silicon-vias (TSVs). The vias may comprise conductive material to facilitate electrical connection between the region above the upper plane of the package substrate and the region below the lower plane of the package substrate.

According to at least one example of a second aspect there is provided a transducer package comprising:

a first package substrate, the first package substrate comprising a package substrate according to an example of the first aspect, a second package substrate provided in a plane overlying the first package substrate, the second package substrate comprising a cavity which is formed through the second package substrate from an upper surface to a lower surface thereof, wherein the cavity overlies at least a part of the recessed region of the first package substrate.

Thus, an upper surface of the first package substrate may be provided in contact with the lower surface of the second package substrate. The recessed region in conjunction with the lower surface of the second package substrate may define a channel. The channel may be considered to extend from a mouth region of the channel in a first direction towards a region underlying the cavity of the first package substrate. The mouth region may define a sound port of the transducer package. The sound port may therefore be provided at a side surface of the transducer package.

According to at least one example of a third aspect there is provide a MEMS transducer package according to an example of the second aspect and further comprising a MEMS microphone transducer.

The MEMS microphone transducer typically comprises a flexible membrane which deflects in response to a pressure differential across the membrane, wherein the flexible membrane overlies the cavity of the second package substrate.

The MEMS transducer package may further comprise electronic circuitry. The electronic circuitry may comprises an integrated circuit chip. The integrated circuit chip may be provided on the upper surface of the second package substrate. Alternatively, the integrated circuit chip is provided between the upper and lower surfaces of the second package substrate. For example, the second package substrate may comprises an aperture which extends from an upper surface of the second package substrate to the lower surface of the second package substrate, wherein the integrated circuit chip is provided within the aperture. In this arrangement the integrated circuitry chip may be connected to the second package substrate by a connecting frame, formed e.g. of an epoxy mould material, which is formed between the outer boundary of the integrated circuit chip and the side wall(s) of the aperture. The second package substrate may be formed of a semiconductor material, e.g. silicon.

According to at least one example the MEMS transducer package comprises an external electrical contact is provided on an exterior surface of the first package substrate. A conductive path may be provided between an integrated circuit chip of the package and the electrical contact, the conductive path comprising one or more of: a conductive wire, a conductive via, a conductive redistribution layer.

According to at least one example the MEMS transducer package comprises a lid portion, the lid portion being provided on the upper surface of the second package substrate to define a chamber.

According to an example of a further aspect there is provided a wafer comprising a plurality of wafer portions, each wafer portion comprising a recessed region, wherein the recessed region extends only partially through the package substrate from an opening in the upper surface of the package substrate in a first direction towards the lower surface of the substrate, and wherein the recessed region extends only partially through the package substrate from an opening in a side surface of the package substrate in a second direction towards an opposite side surface.

According to a further aspect there is provided an electronic device comprising a MEMS transducer package according to an example of the third aspect. The device may comprise a cover, the cover being provided with a sound port and wherein the MEMS transducer package is mounted within the electronic device such that an orthogonal projection of the mouth region of the recess defined by the substrate layer coincides with sound port. The device may be at least one of: a portable device; a battery powered device; an audio device; a computing device; a communications device; a personal media player; a headphone, a mobile telephone; a games device; and a voice controlled device.

According to a further aspect there is provided a method of fabricating a MEMS transducer package according to the present examples.

According to a further aspect there is provided a method of fabricating a package according to the present examples.

According to a further aspect there is provided a method of fabricating a wafer according to the present examples.

For a better understanding of the present invention, and to show how the same may be carried into effect, reference will now be made by way of example to the accompanying drawings in which:

FIG. 5 illustrates a package substrate 300 according to a first example;

The description below sets forth examples and arrangements according to this disclosure. Further examples, arrangements and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

The methods described herein can be implemented in a wide range of devices and systems including headphones, audio players, laptops, mobile phones, PDAs, hands-free sets, voice activated or voice-controlled devices and personal computers.

Figure 1A:
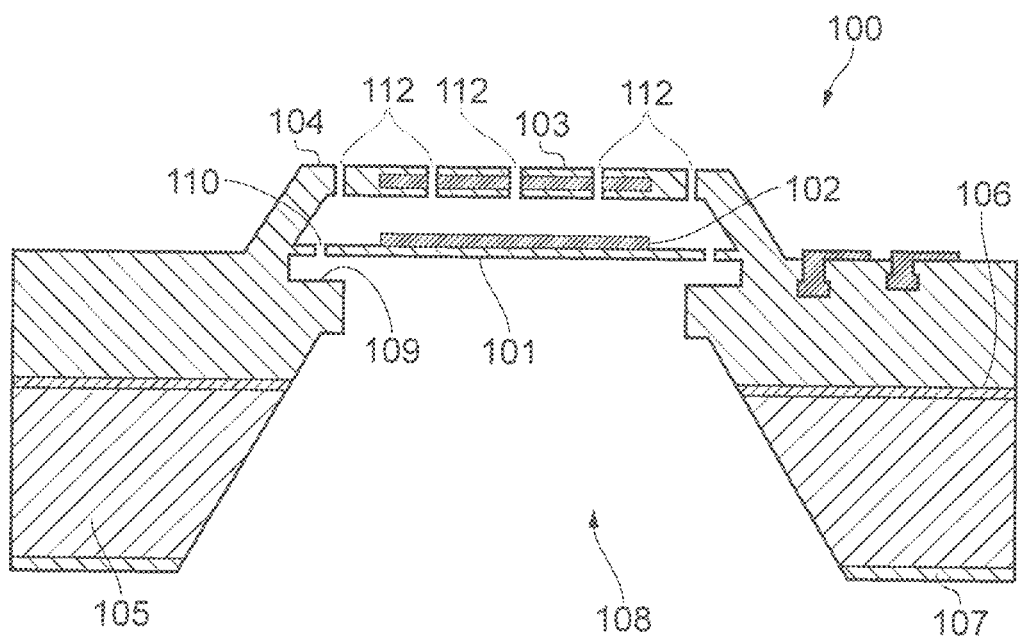
FIGS. 1a and 1b show a schematic diagram and a perspective view, respectively, of a known capacitive MEMS microphone device.
Figure 1B:
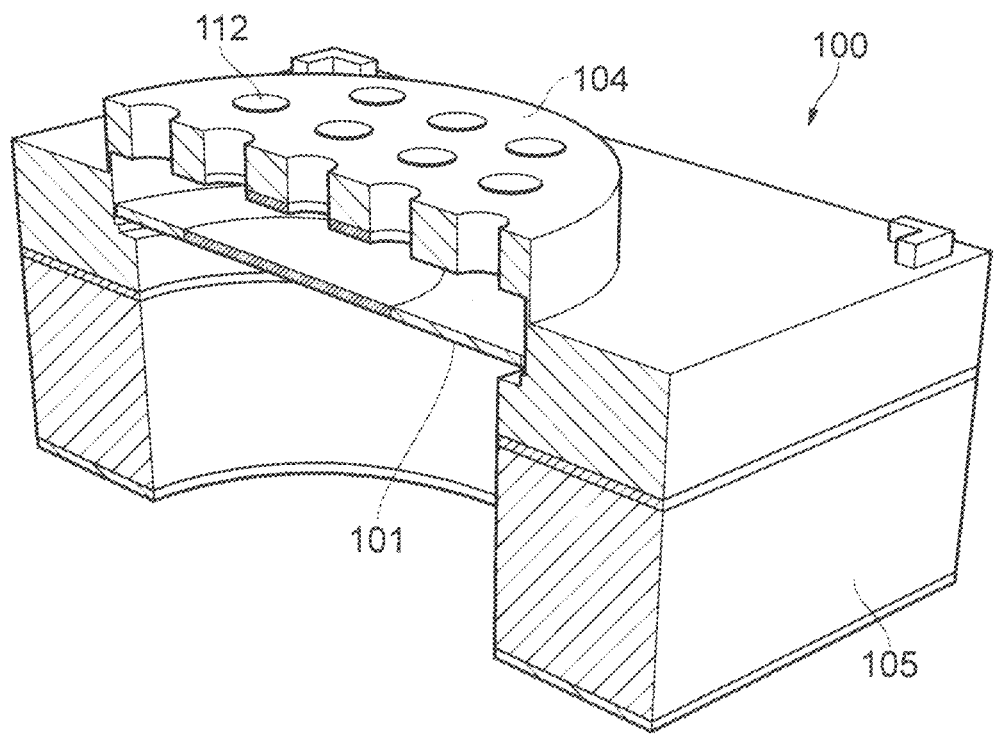

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the back-plate 104 so as to allow free movement of air molecules through the back plate, such that the second cavity 10 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst FIGS. 1a and 1b show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Figure 2A:
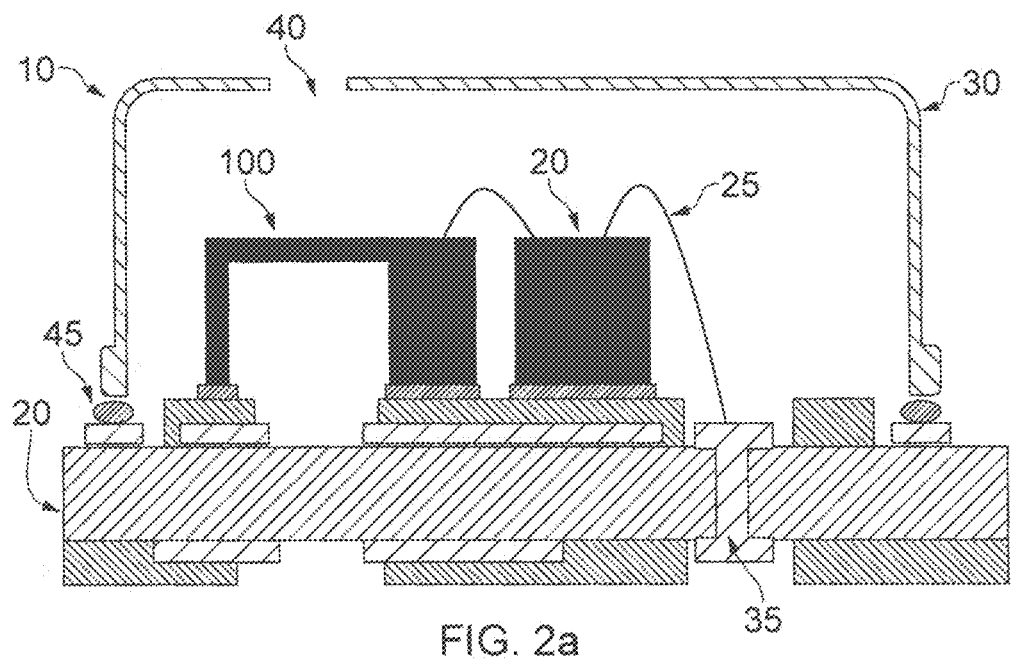
FIGS. 2a and 2b illustrate previously proposed lid-type packages.
Figure 2B:
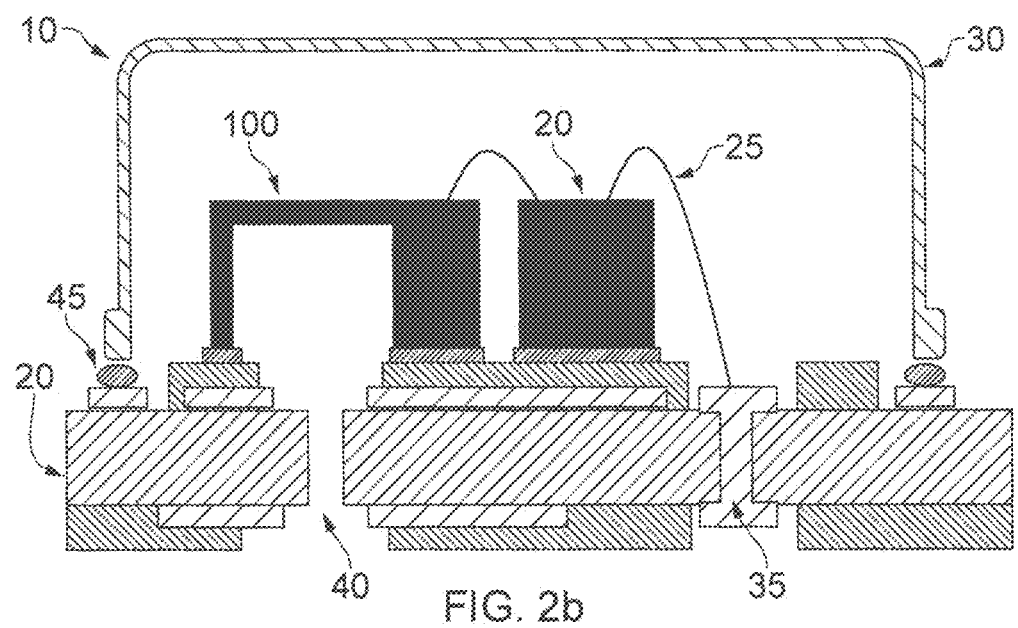

FIGS. 2a and 2b illustrate "lid-type" packages 10. A MEMS transducer 100 is mounted to an upper surface of a package substrate 20. The package substrate 20 may be PCB (printed circuit board) or any other suitable material. A cover or "lid" 30 is located over the transducer 100 and is attached to the upper surface of the package substrate 20 by means of e.g. epoxy resin or solder 45. The cover 30 may be a metallic lid. In FIG. 2a, an aperture 40 in the cover 30 provides a sound port and allows acoustic signals to enter the package. In FIG. 2b an aperture 40 in the substrate 20 provides the sound port and the MEMS transducer is mounted such that the flexible membrane of the transducer extends over the sound port. According to convention, the configuration shown in FIG. 2a—in which the sound port 40 is provided on opposite side of the package to the external electrical connection 35—is known as a "top port" configuration. The configuration shown in FIG. 2b—on which the sound port 40 is provided on the same side of the package to the external electrical connection 35—is known as a "bottom port" configuration. It will be appreciated that the terms "top port" and "bottom port" do not imply any particular orientation of the package device either during manufacture, processing or any subsequent application.

The package may also contain an integrated circuit 15. The integrated circuit will typically be formed on a die of semiconductor material and will be customised for a particular application. The integrated circuit will be electrically connected to electrodes of the transducer 100 and an electrically conductive path 25 will be provided between the integrated circuit and an electrical connection 35 provided on an external surface of the package. The integrated circuit may provide bias to the transducer and may buffer or amplify a signal from the transducer. It will be appreciated that according to an alternative arrangement (not shown) the integrated circuit may be provided as a monolithic device whereby the electronic circuitry is fully integrated within the same die as the microphone transducer.

Figure 3A:
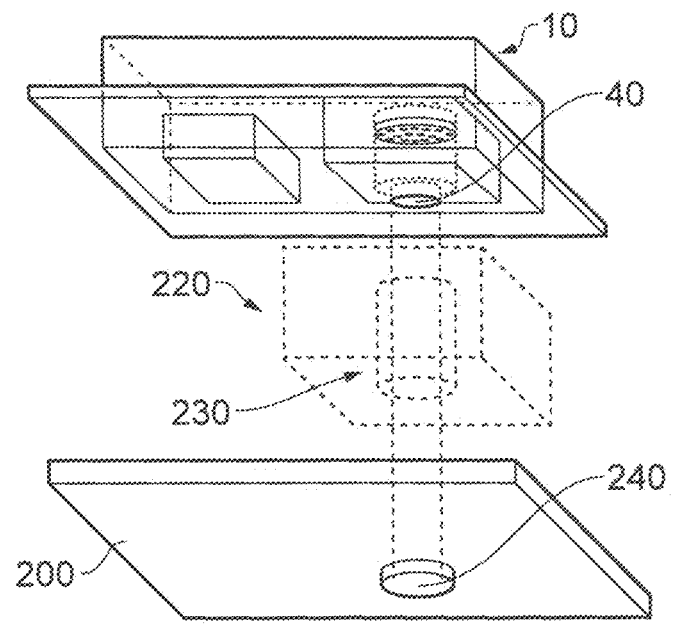
FIG. 3 illustrates the relative alignment between a sound port of a microphone package and the sound port of a host device.
Figure 3B:
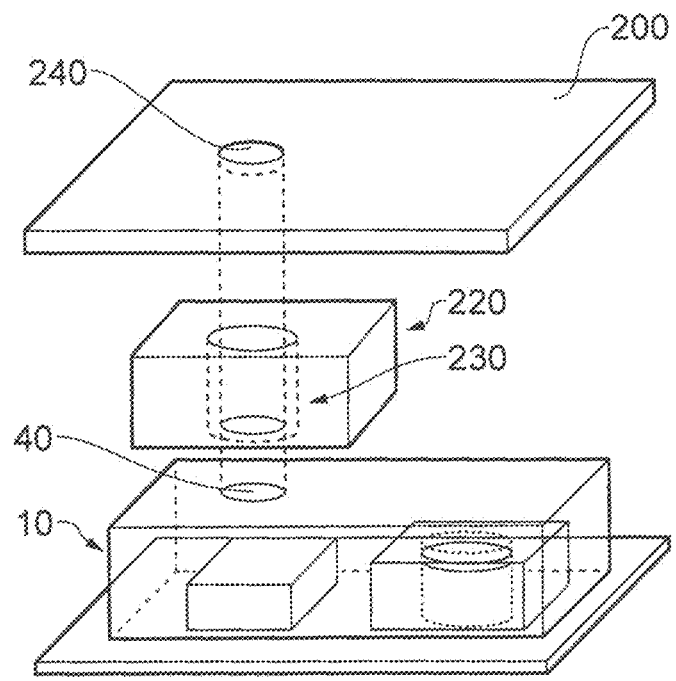

FIG. 3 illustrates the relative arrangement between a sound port 40 of a microphone package 10 and the acoustic port 240 of the device cover 200 in circumstances where the sound ports can be considered to be aligned or mutually overlapping in the sense that the region of the ports will at least partially overlap when considering a perpendicular projection—indicated by dashed lines—of either one of the ports onto the plane of the other port. Specifically, FIG. 3a illustrates the relative alignment in the case of a bottom port microphone package whilst FIG. 3b illustrates the relative alignment in the case of a top port microphone package. An interposer member 220, or gasket, is provided between the port 40 of the package and the port 240 of the device cover. The interposer member provides a sealed longitudinal channel between the two ports allowing acoustic pressure waves that enter the sound port of the device to travel into the MEMS microphone package for detection.

Figure 4:
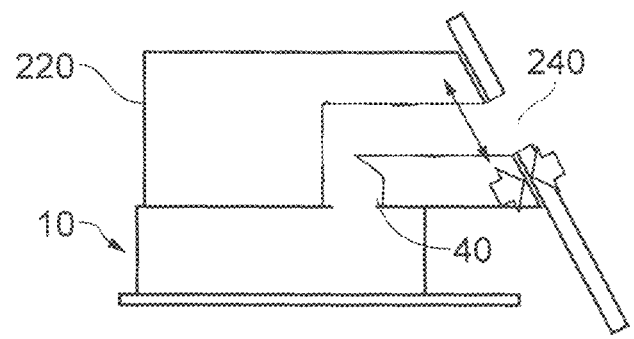
FIG. 4 illustrates a lack of alignment between a sound port of a microphone package and the sound port of a host device.

FIG. 4 illustrates a prior arrangement in which there is a lack of alignment between the sound port 40 of the microphone package and the sound port 240 of the device cover. Thus, a tortuous or non-straight path is defined between the two ports. In this case an interposer member 220 comprises a channel having first and second portions, wherein the second portion extends at an angle relative to the first portion. In other words, the channel defined by the interposer member 229 comprises a bend. A number of difficulties may arise in this arrangement, In particular there is a risk of inadequate sealing pressure between the device cover and the interposer member. This potentially allows incoming pressure waves to leak around the gasket rather than progressing to the microphone package for detection. There is also a risk of the interposer becoming deformed and/or displaced with respect to its intended position. Furthermore, there is also a risk that the interposed may fold or collapse.

FIG. 5 illustrates a package substrate 300 according to a first example. Specifically FIG. 5a provides a plan view of the package substrate 300 and FIG. 5b provides a cross sectional view of the package substrate 300 through the line A-A of FIG. 5a. The package substrate can be considered to comprise first 301 (upper) and second 302 (lower) surfaces. The upper and lower surfaces run parallel to and/or define a main plane of the package substrate 300.

The package substrate 300 comprises a recessed region 310 formed in the upper surface of the package substrate. As shown more clearly in FIG. 5b the recessed region extends only part of the way through the package substrate from an opening 303 in the upper surface 301 of the package substrate in a first direction towards the lower surface 302 of the package. Thus the recessed region can be considered to extend in a first direction 0 substantially orthogonal to the direction of the main plane P of the package substrate. The recessed region 310 also extends only part of the way through the package substrate from an opening 304 in a side surface of the package substrate in a second direction P towards the opposite side surface of the package substrate. Thus, the recessed area can be considered to extend in a second direction substantially in parallel to or aligned with the main plane P of the package substrate.

The package substrate may be formed of a semiconductor material such as silicon. Thus, the recessed region 310 may be considered to be a region where the semiconductor material has been removed or is absent. The package substrate may additionally comprise one or more small apertures (not shown) which extend through the substrate and which define one or more vias to facilitate electrical connections between the upper and lower surface of the package substrate 300.

According to at least one example there is provided a method of fabricating a package substrate comprising the step of removing material from a substrate portion to define a recessed region. It should be noted that, for ease, the referenced Figures show a single unit. However, during a fabrication process according to at least one aspect the eventual package substrate may, in an earlier processing stage, form a single wafer portion of a wafer comprising a plurality of wafer portions. Thus, the present examples will advantageously involve the fabrication of multiple package substrates at one time, for example as an array or batch of units. It will also be appreciated that multiple intermediate products arise during the fabrication process and that the present examples extend to those intermediate products.

Thus, according to a further example there is provided a wafer comprising a plurality of wafer portions, each wafer portion comprising a recessed region. The formation of the plurality of recessed regions may be beneficially carried out at wafer level during a single processing stage. During a subsequent processing stage the wafer is diced to define a plurality of individual wafer portions.

Figure 6:
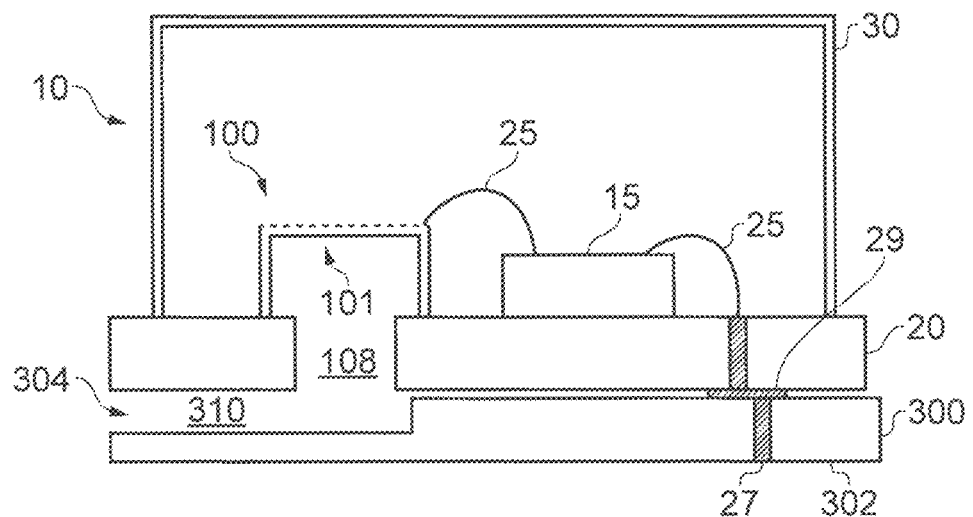
FIG. 6 illustrates a MEMS transducer package according to a present example.

According to at least one example the package substrate may form part of, or be provided in conjunction with, a transducer package such as MEMS transducer package. Thus, as illustrated in FIG. 6, a package substrate 300 similar to the package substrate illustrated in FIG. 5 may be provided as a first package substrate, in conjunction with a MEMS transducer package 10 itself having a package substrate which will form a second package substrate of the overall package assembly. The MEMS transducer package 10 comprises a MEMS transducer 100 mounted on the upper surface of a second package substrate 20 so as to overly a cavity 108 formed through the second package substrate 20. In this example an application specific integrated circuit (ASIC) 15 is also mounted to the upper surface of the package substrate and a lid 30 encloses both the MEMS transducer 100 and the ASIC 15 within a chamber defined by the lid. The recessed region 310 of the first package substrate 300 extends in a planar direction from an opening 304 at the side of the first package substrate towards the opposite side surface of the package substrate 300. The recessed region 310 also defines an opening 303 which is arranged such that the cavity 108 provided in the second package substrate overlaps at least a part of the opening 303. Metal vias 27 are optionally provided in both the first and second package substrates. At least one redistribution layer (RDL) 29 is formed on an upper surface of the first package substrate 300. Thus, a conductive path is provided from the MEMS transducer to the ASIC 15 by a conductive wire 25, and from the ASIC 15 to an external contact provided on the underside of the first package substrate 300, by a conductive wire 25, metal vias 27 and an RDL 29.

It will be appreciated that the recessed region effectively defines a channel which extends from the opening 304, which can be considered to be a mouth of the channel, to a region underlying the flexible membrane 101 of the MEMS transducer. The channel is effectively closed by the boundary walls of the recessed region and the overlying surface of the second package substrate 20. Thus, the channel provides a conduit or passage for sound waves incident on the mouth 304 of the channel to be directed towards the front side of the flexible membrane 101 of the transducer 100. The mouth 304 can be considered to define a sound port of the transducer package assembly.

According to the arrangement shown in FIG. 6 the sound port of the package is thus located at a side surface of the package assembly. As such, the package assembly, in particular as a consequence of the recessed region formed in the package substrate 300, may be particularly beneficial for use in circumstances where there is a need to direct or channel sound waves towards the flexible membrane of the transducer from a region laterally adjacent the package when mounted in a host device.

In a co-filed application entitled "Semiconductor Structures" filed by the present Applicant on the same day as the present application, a substrate design is described. According to one example the substrate is formed of semiconductor material, such as silicon, and comprises a first region and a second region. In the first region the semiconductor substrate (which can be considered to form a primary substrate) is processed to comprise a MEMS microphone transducer. In the second region, the semiconductor substrate comprises at least one hole, the hole extending through the semiconductor substrate from an upper surface of the semiconductor substrate to a lower surface of the semiconductor substrate. The hole exhibits planar dimensions sufficient to accommodate the planar dimensions of a discrete secondary substrate. A secondary or "child" substrate is provided in the hole, between the upper and lower surfaces of the primary substrate. The secondary substrate is held within the aperture by means of a fixing frame formed of, e.g. an epoxy mould material. Thus, the hole exhibits planar dimensions sufficient to accommodate the planar dimensions of a discrete secondary substrate. According to one particular arrangement, the secondary substrate comprises a circuitry chip. Thus, the circuitry chip can be considered to be integrated within the plane of the primary substrate.

It will be appreciated that there may be an additional need to reduce the height of the transducer package in scenarios where the package is to be mounted in a device where limited headroom is available. According to at least one example, a package substrate according to the present examples may be beneficially provided in conjunction with a semiconductor substrate comprising a MEMS transducer and a circuitry chip according to the aforementioned application. The resultant transducer package 400 is illustrated in FIG. 7.

Figure 7:
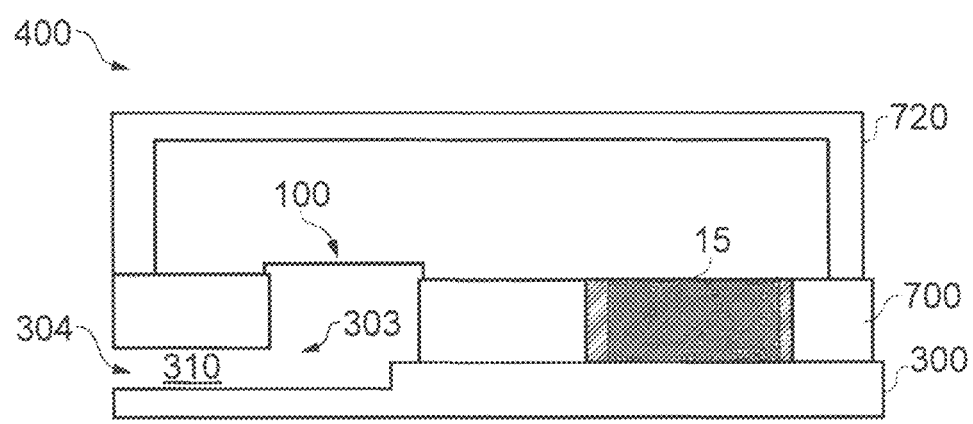
FIG. 7 illustrates a MEMS transducer package according to a further present example.

Thus, according to the example illustrated in FIG. 7 a package substrate 300 according to the present aspects may be provided as a first package substrate. The first package substrate 300 is provided in conjunction with a semiconductor substrate 700 according to the aspects described in the aforementioned co-filed application. The semiconductor substrate 700, which can be considered to be a second package substrate, comprises a MEMS transducer 100 formed at a transducer region of the substrate. A secondary circuitry die 15 is embedded at a second region of the semiconductor substrate within the plane of the semiconductor substrate between the upper and lower planar surfaces thereof. Optionally, a lid 720 is mounted on an upper surface of the semiconductor substrate to define the back volume of the MEMS microphone transducer 702. The lid may comprise a metal lid, a PCB lid or may be formed of a wafer portion of a third wafer which defines a plurality of recessed cap wafers. It will be appreciated that since the integrated circuitry chip is at least partially provided between the upper and lower surfaces of the semiconductor substrate 700, additional volume within the package chamber is available. Thus, this arrangement potentially increases the back volume of the transducer and/or allows for the lid height to be reduced.

The semiconductor substrate 700 is mounted on, or bonded to, a package substrate 300 comprising a recessed region 310. The recessed region effectively defines a channel which extends from the opening 304, which can be considered to be a mouth of the channel, to a region underlying the flexible membrane of the MEMS transducer 101. The channel is effectively closed by the boundary walls of the recessed region and the overlying surface of the second package substrate 20. Thus, the channel provides a conduit or passage for sound waves incident on the mouth 304 of the channel to be directed towards the front side of the flexible membrane of the transducer 100. The mouth 304 can be considered to define a sound port of the transducer package assembly.

An external contact (not shown) may be provided on the underside of the package substrate 300 and an electrical path provided from the ASIC 15 to the external contact and also between the ASIC 15 and the MEMS transducer 100. It will be appreciated that the electrical path may be provided by means of one or more of: electrical wire(s), metal via(s) formed in either or both of the semiconductor substrate 700 and the package substrate 300, and redistribution layers (RDLs) formed on the upper and/or lower surfaces of the package substrate.

In circumstances where the first package substrate 300 is formed of a semiconductor material such as silicon, there are manufacturing advantages to be gained in providing the first package substrate in conjunction with a second, semiconductor substrate according to the co-filed application. It will be appreciated that the package may be formed at wafer level by a process of wafer to wafer bonding of first and second wafers. The first wafer, comprising e.g. a silicon wafer, defines a plurality of first wafer regions, each first wafer region comprising a recessed region according to the present aspects. The second wafer, comprising a plurality of second wafer portions, is processed in a first region of each of the second wafer portions to provide a MEMS microphone transducer and in a second region of each of the second wafer portions to comprise a hole. Advantageously, during the processing of the second wafer, the transducer cavity of each of the MEMS microphone transducers may be formed at substantially the same time as forming the holes e.g. by a process of etching. The two wafers are arranged such that the first wafer portions and the second wafer portions are substantially aligned and are bonded together to form a two-layer wafer assembly.

Figure 8:
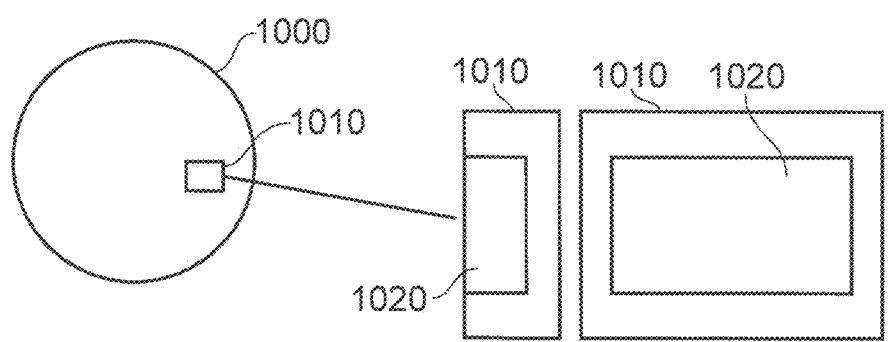
FIG. 8 shows a cap wafer comprising a plurality of cap wafer portions.

According to at least one example, and as illustrated in FIG. 8 a wafer assembly comprising a third wafer, in addition to the first and second wafers discussed above, may be provided. Thus, FIG. 8 shows a cap wafer 1000 comprising a plurality of cap wafer portions 1010. Each of the cap portions is processed to comprise a recessed area 1020. The recessed area does not intersect the boundary of the cap wafer portion and may optionally be plated with a metal material in order to act as a barrier to RF noise and interference. The wafer can be considered to be a cap wafer since each of the cap wafer portions is indented to define a cap portion (or lid) for a transducer package. Thus, according to a process of the present aspects, a cap wafer as illustrated in FIG. 8 may be arranged relative to a second wafer described above. Thus, the recessed area of a given cap wafer portion defines side walls which are mounted to the upper surface of a second package substrate in a process known as wafer to wafer bonding. Thus, the cap portion in conjunction with the second package substrate defines a package chamber.

Singulation of the wafer assembly produces a plurality of individual transducer packages, each package having a sound port for the ingress of acoustic pressure waves that is provided laterally outside the region underlying the MEMS transducer. The process of singulating two silicon wafers is relatively clean and simple compared to the singulation of a PCB wafer which involves a different sawing technique.

Semiconductor chip fabrication techniques are evolving rapidly, driven by a desire to streamline the manufacture, testing and packaging of electronic components. It will be appreciated that the processing of multiple electronic systems in a single operation—often referred to as "batch processing"—is highly advantageous. Wafer level processing (which may comprise single-wafer processing or batch processing of multiple wafers) is cost-effective and produces consistent and repeatable results. The present aspects beneficially lend themselves to wafer- and/or batch-level processing techniques.

Figure 9:
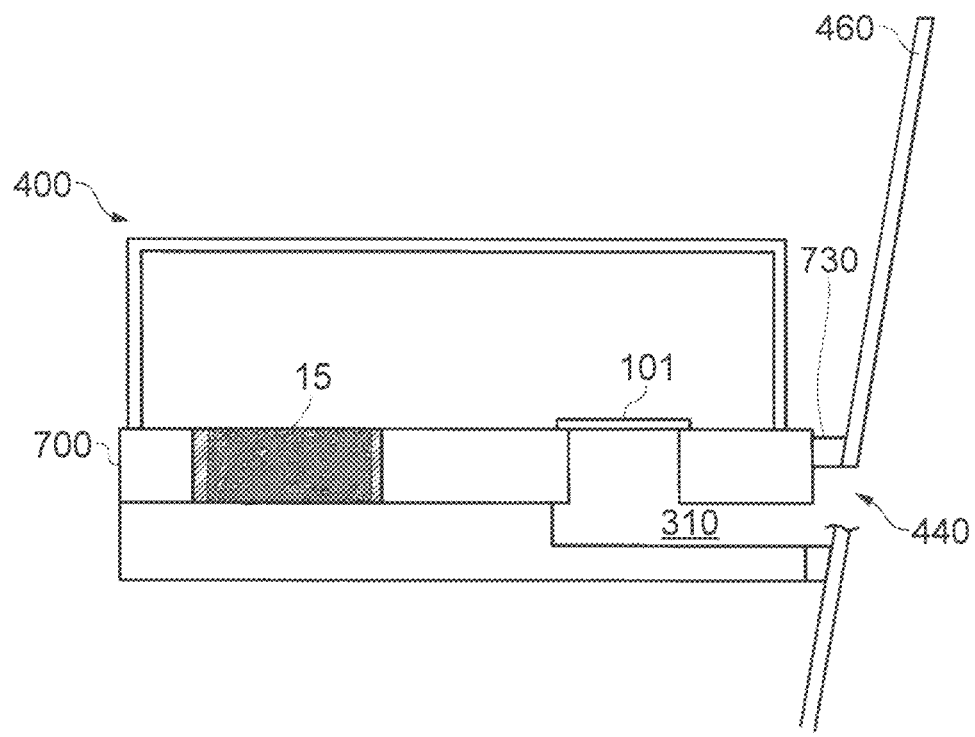
FIG. 9 illustrates a transducer package according to a present example, mounted in a host device.

FIG. 9 illustrates a transducer package similar to the transducer package 400 illustrated in FIG. 7 mounted in a host device. A portion of the cover 460 of the device is illustrated, the cover comprising an acoustic port 440. The transducer package 400 comprises a first package substrate 700 having a recessed region 310. Sound waves incident on the exterior of the host device and in the vicinity of the acoustic port 440 will enter the interior of the host device via the acoustic port 440 and into the mouth 304 of the channel defined by the recessed region 310 in conjunction with the lower surface of the second package substrate. A sealing member 730 which may comprise a single portion or multiple components is provided to ensure that the sound waves do not leak around the transducer package 400 but are instead channelled into the front volume of the MEMS transducer by the channel. The sealing member can be considered to be an interposer member or gasket.

There are a number of advantages associated with this arrangement wherein the sound port of the transducer package is located at a side surface of the package substrate. In particular, the need to provide a complex, e.g. non-longitudinal, interposer member between the sound port of the device cover and the sound port of the package is obviated. Instead, a simple interposer defining a longitudinal channel may be provided. The channel thus provides an effective solution for channelling sound waves from a region laterally adjacent the package to the underside of the flexible membrane.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

It is noted that the example embodiments described above may be used in a range of devices, including, but not limited to: analogue microphones, digital microphones, pressure sensors or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer package, a package substrate and a wafer are respectively provided.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A transducer package comprising:
    a first package substrate, the first package substrate comprising a recessed region formed in an upper surface of the first package substrate, wherein the recessed region extends only partially through the first package substrate from an opening in the upper surface of the first package substrate in a first direction towards the lower surface of the first package substrate;
    and wherein the recessed region extends only partially through the first package substrate from an opening in a side surface of the first package substrate in a second direction towards an opposite side surface;
    a second package substrate comprising an aperture which extends from an upper surface of the second package substrate to a lower surface of the second package substrate; and
    an integrated circuit chip provided within the aperture of the second package substrate.

2. A transducer package as claimed in claim 1, wherein the first package substrate is formed of a semiconductor material.

3. A transducer package as claimed in claim 2, wherein the recessed region is a region where the semiconductor material has been removed or is absent.

4. A transducer package as claimed in claim 1, further comprising one or more vias, wherein the vias comprise conductive material.

5. A transducer package as claimed in claim 1, wherein:
    the second package substrate is provided in a plane overlying the first package substrate, the second package substrate comprising a sound port which is formed through the second package substrate from an upper surface to a lower surface thereof, wherein the sound port overlies at least a part of the recessed region of the first package substrate.

6. A transducer package as claimed in claim 5, wherein an upper surface of the first package substrate is provided in contact with the lower surface of the second package substrate.

7. A transducer package as claimed in claim 6, wherein the recessed region in conjunction with the lower surface of the second package substrate defines a channel, wherein the channel extends from a mouth region of the channel in a first direction towards a region underlying the sound port of the first package substrate and wherein the mouth region defines a sound port of the transducer package.

8. A transducer package as claimed in claim 5, further comprising a MEMS microphone transducer, wherein the MEMS microphone transducer comprises a flexible membrane which deflects in response to a pressure differential across the membrane, and wherein the flexible membrane overlies the sound port of the second package substrate.

9. A transducer package as claimed in claim 8, wherein the integrated circuit chip is provided on the upper surface of the second package substrate.

10. A transducer package as claimed in claim 8, wherein the integrated circuit chip which is provided between the upper and lower surfaces of the second package substrate.

11. A transducer package as claimed in claim 10, wherein the integrated circuitry chip is connected to the second package substrate by a connecting frame which is formed between the outer boundary of the integrated circuit chip and the side wall(s) of the aperture.

12. A transducer package as claimed in claim 10, wherein the second package substrate is formed of a semiconductor material.

13. A transducer package as claimed in claim 5, wherein an external electrical contact is provided on an exterior surface of the first package substrate.

14. A transducer package as claimed in claim 5, further comprising a lid portion, the lid portion being provided on the upper surface of the second package substrate to define a chamber.

15. A first wafer comprising a plurality of first wafer portions, each of the first wafer portions to define a first package substrate for a MEMS transducer package, each first wafer portion comprising a recessed region, wherein the recessed region extends only partially through the first package substrate from an opening in the upper surface of the first package substrate in a first direction towards the lower surface of the first package substrate;
    and wherein the recessed region extends only partially through the first package substrate from an opening in a side surface of the first package substrate in a second direction towards an opposite side surface; and
    a second wafer comprising a plurality of second wafer portions, each of the second wafer portions to define a second package substrate for a MEMS transducer package, each second wafer portion comprising an aperture which extends from an upper surface of the second wafer portion to a lower surface of the second wafer portion and which is suitable for receiving an integrated circuit chip.

16. An electronic device comprising a transducer package as claimed in claim 5.

17. An electronic device as claimed in claim 16, wherein the device comprises a cover, the cover being provided with a sound port and wherein the transducer package is mounted within the electronic device such that an orthogonal projection of the mouth region of the recess defined by the substrate layer coincides with sound port.

18. An electronic device as claimed in claim 16, wherein the device is at least one of: a portable device; a battery powered device; an audio device; a computing device; a communications device; a personal media player; a headphone, a mobile telephone; a games device; and a voice controlled device.

19. The first wafer as claimed in claim 15, wherein an integrated circuit chip is provided within the aperture of the second wafer portion.

* * * * *